United States Patent
Roscheisen et al.

(10) Patent No.: US 7,511,217 B1
(45) Date of Patent: *Mar. 31, 2009

(54) INTER FACIAL ARCHITECTURE FOR NANOSTRUCTURED OPTOELECTRONIC DEVICES

(75) Inventors: Martin R. Roscheisen, San Francisco, CA (US); Brian M. Sager, Palo Alto, CA (US); Klaus Petritsch, Foster City, CA (US); Jacqueline Fidanza, San Francisco, CA (US)

(73) Assignee: Nanosolar, Inc., Palo Alto, CA (US)

( * ) Notice: Subject to any disclaimer, the term of this patent is extended or adjusted under 35 U.S.C. 154(b) by 626 days.

This patent is subject to a terminal disclaimer.

(21) Appl. No.: 10/419,708

(22) Filed: Apr. 19, 2003

(51) Int. Cl.
*H01L 31/00* (2006.01)
(52) U.S. Cl. ...................... 136/263; 136/256
(58) Field of Classification Search ................ 136/263, 136/256
See application file for complete search history.

(56) References Cited

U.S. PATENT DOCUMENTS

| | | | |
|---|---|---|---|
| 4,499,658 A | 2/1985 | Lewis | |
| 4,865,999 A | 9/1989 | Xi et al. | |
| 4,939,050 A | 7/1990 | Toyosawa et al. | |
| 5,482,570 A | 1/1996 | Saurer et al. | ................. 136/255 |
| 5,525,440 A | 6/1996 | Kay et al. | ................... 429/111 |
| 5,571,612 A | 11/1996 | Motohiro et al. | ............ 428/323 |
| 6,270,846 B1 | 8/2001 | Brinker et al. | ............ 427/385.5 |
| 6,278,056 B1 | 8/2001 | Sugihara et al. | ............. 136/263 |
| 6,291,763 B1 | 9/2001 | Nakamura | ................... 136/256 |

(Continued)

FOREIGN PATENT DOCUMENTS

DE    2741954    3/1979

(Continued)

OTHER PUBLICATIONS

Maggini, M., Possamai, G., Menna, E., Scorrano, G., Camaioni, N., Ridolfi, G., Casalbore-Miceli, G., Franco, L., Ruzzi, M., and Corvaja, C., Solar cells based on a fullerene-azothiophene dyad, Chemical Communications, DOI: 10.1039/b206275e, Aug. 13, 2002, pp. 1-5.*

(Continued)

*Primary Examiner*—Nam X Nguyen
*Assistant Examiner*—Jeffrey T. Barton
(74) *Attorney, Agent, or Firm*—Joshua D. Isenberg; JDI Patent

(57) ABSTRACT

An optoelectronic apparatus, a method for making the apparatus, and the use of the apparatus in an optoelectronic device are disclosed. The apparatus may include an active layer having a nanostructured network layer with a network of regularly spaced structures with spaces between neighboring structures. One or more network-filling materials are disposed in the spaces. At least one of the network-filling materials has complementary charge transfer properties with respect to the nanostructured network layer. An interfacial layer, configured to enhance an efficiency of the active layer, is disposed between the nanostructured network layer and the network-filling materials. The interfacial layer may be configured to provide (a) charge transfer between the two materials that exhibits different rates for forward versus backward transport; (b) differential light absorption to extend a range of wavelengths that the active layer can absorb; or (c) enhanced light absorption, which may be coupled with charge injection.

32 Claims, 4 Drawing Sheets

U.S. PATENT DOCUMENTS

| | | | |
|---|---|---|---|
| 6,340,789 B1 | 1/2002 | Petritsch et al. | 136/263 |
| 6,414,235 B1 | 7/2002 | Luch | |
| 6,444,296 B1 | 9/2002 | Sasaki et al. | |
| 6,472,594 B1 | 10/2002 | Ichinose et al. | |
| 6,515,218 B1 | 2/2003 | Shimizu et al. | |
| 6,517,958 B1 | 2/2003 | Sellinger et al. | |
| 6,586,670 B2 * | 7/2003 | Yoshikawa | 136/263 |
| 6,586,764 B2 | 7/2003 | Buechel et al. | |
| 6,706,962 B2 | 3/2004 | Nelles et al. | |
| 6,852,920 B2 | 2/2005 | Sager et al. | |
| 6,936,761 B2 | 8/2005 | Pichler | |
| 6,946,597 B2 | 9/2005 | Sager et al. | |
| 7,087,831 B2 * | 8/2006 | Den et al. | 136/250 |
| 7,247,346 B1 | 7/2007 | Sager et al. | |
| 7,253,017 B1 | 8/2007 | Roscheisen et al. | |
| 7,291,782 B2 | 11/2007 | Sager et al. | |
| 2002/0017656 A1 | 2/2002 | Graetzel et al. | 257/184 |
| 2002/0134426 A1 | 9/2002 | Chiba et al. | 136/263 |
| 2002/0192441 A1 | 12/2002 | Kalkan et al. | 428/209 |
| 2003/0005955 A1 | 1/2003 | Shiotsuka et al. | |
| 2003/0201010 A1 * | 10/2003 | Koyanagi et al. | 136/263 |
| 2003/0204038 A1 | 10/2003 | Xiao et al. | |
| 2003/0226498 A1 | 12/2003 | Alivisatos et al. | 117/84 |
| 2004/0084080 A1 | 5/2004 | Sager et al. | 136/263 |
| 2004/0103936 A1 | 6/2004 | Andriessen | |
| 2004/0109666 A1 | 6/2004 | Kim, II | |
| 2004/0118448 A1 | 6/2004 | Sager et al. | 136/252 |
| 2004/0146560 A1 | 7/2004 | Whiteford et al. | 424/484 |
| 2004/0178390 A1 | 9/2004 | Whiteford et al. | 252/500 |
| 2004/0219730 A1 | 11/2004 | Basol | |
| 2004/0250848 A1 | 12/2004 | Sager et al. | |
| 2005/0045874 A1 | 3/2005 | Xiao et al. | |
| 2005/0098204 A1 | 5/2005 | Roscheisen et al. | |
| 2005/0098205 A1 | 5/2005 | Roscheisen et al. | |
| 2005/0121068 A1 | 6/2005 | Sager et al. | |
| 2005/0183767 A1 | 8/2005 | Yu et al. | |
| 2005/0183768 A1 | 8/2005 | Roscheisen et al. | |
| 2005/0206306 A1 | 9/2005 | Perlo et al. | |
| 2006/0174934 A1 | 8/2006 | Sager et al. | |

FOREIGN PATENT DOCUMENTS

| | | |
|---|---|---|
| EP | 1028475 A1 | 8/2000 |
| EP | 1087446 A2 | 3/2001 |
| JP | 2000-077691 * | 3/2000 |
| WO | WO 02/084708 | 10/2002 |

OTHER PUBLICATIONS

Li, A. P., Muller, F., Birner, A., Nielsch, K., and Gosele, U., Polycrystalline nanopore arrays with hexagonal ordering on aluminum, J. Vac. Sci. Technology A, vol. 17, No. 4, 1999, pp. 1428-1431.*

D. Zhao et al. "Triblock Copolymer Syntheses of Mesoporous Silica with Periodic 50 to 300 Angstrom Pores" Science, 279, 548-552. (1998).

R. Ryoo et al. "Block-Copolymer-Templated Ordered Mesoporous Silica: Array of Uniform Mesopores or Mesopore-Micropore Network?" J. Phys. Chem. B. 104, 11465-11471. (2000).

M.H. Huang et al. "Catalytic Growth of Zinc Oxide Nanowires by Vapor Transport" Adv. Mater. 13, 113-116 (Jan. 2001).

M. Granstrom, K. Petritsch, A. C. Arias, A. Lux, M. R. Andersson & R. H. Friend. 1998. Laminated fabrication of polymeric photovoltaic diodes. Nature 395, 257-260.

Gebeyehu, D., Brabec, C.J., Saricifti, N.S., Vangeneugden, D., Kiebooms, R., Vanderzande, D., Kienberger, F., and H. Schnindler. 2002. Hybrid Solar Cells based on dye-sensitized nanoporous TiO2 electrodes and conjugated polymers as hole transport materials. Synthetic Metals 125, 279-287.

Greg P. Smestad, Stefan Spiekermann, Janusz Kowalik, Christian D. Grant, Adam M. Schwartzberg, Jin Zhang, Laren M. Tolbert, and Ellen Moons. 2002. A technique to compare polythiophene solid-state dye sensitized TiO2 solar cells to liquid junction devices. Solar Energy Materials & Solar Cells, in press.

Hongyou Fan, Yunfeng Lu, Aaron Stump, Scott T. Reed, Tom Baer, Randy Schunk, Victor Perez-Luna, Gabriel P. Lopez & C. Jeffrey Brinker. 2000. Rapid prototyping of patterned functional nanostructures, Nature 405, 56-60.

Alan Sellinger, Pilar M.Weiss, Anh Nguyen, Yunfeng Lu, Roger A. Assink, Weiliang Gong & C. Jeffrey Brinker, 1998. Continuous self-assembly of organic—inorganic nanocomposite coatings that mimic nacre. Nature 394, 256-260.

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. "Continuous formation of supported cubic and hexagonal mesoporous films by sol—gel dip-coating," Nature 389, Sep. 25, 1997.

L. Schmidt-Mende, A. Fechtenkotter, K. Mullen, E. Moons,R. H. Friend, J. D. MacKenzie. 2002. Self-Organized Discotic Liquid Crystals for High-Efficiency Organic Photovoltaics. Science 293, 1119-1122.

Wendy U. Huynh, Janke J. Dittmer, A. Paul Alivisatos. 2002. Hybrid Nanorod-PolymerSolar Cells. Science 295, 2425-2427.

Thuc-Quyen Nguyen, Junjun Wu, Vinh Doan, Benjamin J. Schwartz, Sarah H. Tolbert. 2000. Control of Energy Transfer in Oriented Conjugated Polymer—Mesoporous Silica Composites. Science 288, 652-656.

Heeger, A.J. 2000. Semiconducting and metallic polymers: the fourth and fifth generation of polymeric materials. Synthetic Metals 125, 23-42.

Michael H. Huang, Amer Choudrey and Peidong Yang, "Ag Nanowire Formation within Mesoporous Silica" Chem. Commun., 2000, 1063-1064.

Andrew A. Gewirth, Panos C. Andricacos, and Jay A. Switzer, with John O. Dukovic, editor "Hot Topics in Electrodeposition", The Electrochemical Society Interface * Spring 1998.

Huang Y, Duan, X, Wei, Q, & C.M. Lieber, "Directed Assembly Of One-Dimensional Nanostructures Into Functional Networks" Science 291(5504):630-633 (2001).

Byung Hee Hong et al., "Ultrathin Single-Crystalline Silver Nanowire Arrays Formed in an Ambient Solution Phase", Science 294: 348-351; Published online Sep. 6, 2001.

Justin D. Holmes, Keith P. Johnston, R. Christopher Doty, and Brian A. Korgel, "Control of Thickness and Orientation of Solution-Grown Silicon Nanowires" Science Feb. 25, 2000; 287: 1471-1473.

Lu et al., "Self-Assembly of Mesoscopically Ordered Chromatic Polydiacetylene Nanocomposites", Nature 410: 913-917 (2001).

Halls et al., "Efficient Photodiodes from interpenetrating Polymer Networks", Nature, vol. 376 Aug. 10, 1995.

O'Regan et al. "A Low-cost, High-efficiency solar cell based on dye-sensitized colloidal $TiO_2$ Films", Nature, vol. 353 pp. 737-740, Oct. 24, 1991.

Mapes et al., "Ionic Conductivities of Poly(siloxane) Polymer Electrolytes with Varying Length of Linear Ethoxy Sidechains, Different Molecular Weights, and Mixed Copolymers", Polymer Preprints, 41(1), pp. 309-310 (2000).

Hooper et al., "A Highly Conductive Solid-State Polymer Electrolyte Based on a Double-Comb Polysiloxane Polymer with Oligo(ethylene oxide) Side Chains", Organometallics, vol. 18, No. 17, Aug. 16, 1999.

U.S. Appl. No. 10/290,119, to Brian M. Sager et al., filed Nov. 5, 2002 and entitled "Optoelectronic Device and Fabrication Methods".

U.S. Appl. No. 10/303,665 to Martin R. Roscheisen et al. entitled "Molding Technique for Fabrication of Optoelectronic Devices" and filed on Nov. 22, 2002.

U.S. Appl. No. 10/319,406 to Brian M. Sager et al., filed Dec. 11, 2002 and entitled "Nano-Architected/Assembled Solar Electricity Cell".

Brabec et al. "Recent Developments in Conjugated Polymer Based Plastic Solar Cells," Monatshefte fur Chemie Chemical Monthly 132, pp. 421-431 (2001) Springer Verlag, Austria.

Brabec et al, "Efficient Bulk Heterojunction Solar Cells from Conjugated Polymer / Fullerene Blends" (Proceedings of the 13th Workshop on Quantum Solar Energy Conversion (QUANTSOL 2001) Mar. 11-17, 2001, Kirchberg in Tirol, Österreich.

L. Forro, L. Mihaly, "Electronic Properties of Doped Fullerenes," *Reports on Progress in Physics* 64 (2001) 649-699.

Shaheen, S.E., Brabec, C.J. Sariciftci, N.S., Padinger, F., Fromherz, T. and J.C. Hummelen. 2001. "2.5% Efficient Organic Plastic Solar Cells." Applied Phys. Letters 78 (6): 841-843.

J. Parisi et al, "Charge Transfer and Transport in Polymer-Fullerene Solar Cells," Z. Naturforsch. 57 a, 995-1000 (2002).

M. Gervaldo et al. "Synthesis of Porphyrin-$C_{60}$ Dyads with Potential Use in Solar Cells" *Fifth International Electronic Conference on Synthetic Organic Chemistry (ECSOC-5)*, http://www.mdpi.org/ecsoc-5.htm, Sep. 1-30, 2001.

E. Arici et al. "Nanocrystalline CIS/Conjugated Polymer based Hybrid Solar Cells," Proceedings of the 14th Workshop on Quantum Solar Energy Conversion—(QUANTSOL 2002), Mar. 17-23, 2002, *Rauris, Salzburg , Österreich*.

T. Fromherz, et al., "Comparison of photovoltaic devices containing various blends of polymer and fullerene derivatives", Solar Energy Materials & Solar Cells, 63 (2000) 61-68.

N.S. Sariciftci, "Role of Buckminsterfullerene in Organic Photoelectric Devices", Prog. Quant. Electr. 19, (1995), 131-159.

Sariciftci, N.S., Bruan, D., Zhang, C., Srdanov, V.I., Heeger, A.J., Stucky, G., and F. Wudl. 1993. Semiconducting Polymer-Buckminsterfullerene Heterojunctions: Diodes, Photodiodes, and Photovoltaic Cells. App. Phys. Lett. 62 (6) 585-587.

Heini Saloniemi, "Electrodeposition of PbS, PbSe and PbTe Thin Films" by Heini Saloniemi, *VTT Publications* 423, Dec. 15, 2000, an electronic copy of which may be accessed at http://www.inf.vtt.fi/pdf/publications/2000/P423.pdf.

Merriam Webster Online Dictionary entry for "substantial" [online], [retrieved on Sep. 15, 2004]. Retrieved from the Internet, <URL: http://www.m-w.com/cgi-bin/dictionary?book=Dictionary&va=substantially>.

Merriam Webster Online Dictionary entry for "template" [online], [retrieved on Jul. 16, 2004]. Retrieved from the Internet ,<URL: http://www.m-w.com/cgi-bin/dictionary?book=Dictionary&va=template>.

Merriam Webster Online Dictionary entry for "include" [online], [retrieved on Jun. 14, 2004]. Retrieved from the Internet ,<URL: http://www.m-w.com/cgi-bin/dictionary?book=Dictionary&va=include>.

U.S. Appl. No. 10/719,041 to Brent J. Bollman et al, filed Nov. 21, 2003 and entitled "Solvent Vapor Infiltration of Organic Materials into Nanostructures".

U.S. Appl. No. 10/338,079 to Martin R. Roscheisen et al., filed Jan. 6, 2003 and entitled "Nanostructured Transparent Conducting Electrode".

U.S. Appl. No. 11/374,877 to Martin R. Roscheisen et al., filed Mar. 13, 2006 and entitled "Molding Technique for Fabrication of Optoelectronic Devices".

U.S. Appl. No. 11/375,515 to Martin R. Roscheisen et al., filed Mar. 13, 2006 and entitled "Nanostructured Transparent Conducting Electrode".

\* cited by examiner

INTERFACIAL ARCHITECTURE FOR NANOSTRUCTURED OPTOELECTRONIC DEVICES

CROSS-REFERENCE TO AN EARLIER FILED APPLICATION

This application is related to U.S. patent application Ser. Nos. 10/290,119, 10/303,665 and 10/319,406, the entire disclosures of which are incorporated herein by reference.

FIELD OF THE INVENTION

This invention relates to optoelectronic devices and more particularly to optoelectronic devices with nanostructured active layers.

BACKGROUND OF THE INVENTION

Optoelectronic devices interact with radiation and electric current. Such devices can be light-emitting devices that produce radiation as a result of an applied electric voltage/current or photovoltaic (PV) devices, e.g., solar cells that produce an electric voltage/current as a result of applied radiation. Optoelectronic devices typically one or more active layers of photoactive material sandwiched between two electrodes. At least one of the electrodes is transparent. The active layer typically includes two materials exhibiting complementary charge transfer (e.g., one is an electron accepting/transporting material and the other is a hole-accepting/transporting material). In the case of a PV device, at least one of the two materials is a light-absorbing material. In an organic solar cell, radiation absorbed by the active layer creates an exciton (an electron-hole pair) at an interface between the two semiconductor materials. Holes and electrons diffuse through the two different materials such that electrons are collected at one electrode and holes are collected at the other. Unfortunately, electrons and holes can recombine before they are collected, which tends to limit the efficiency of a PV device.

Recently, organic materials, such as gels, conjugated polymers, molecules, and oligomers, have been used as photoactive materials. Random blends of fullerenes and hole-accepting polymers have also been used in organic PV cells. However, these random blends were lacking in order. To increase the efficiency of optoelectronic devices it is desirable to configure the active layer such that the presence of hole accepting and electron accepting materials alternates on a scale of length comparable to the exciton diffusion distance. This distance is typically on the order of several nanometers. To optimize efficiency of the active layer, it is desirable for the arrangement of the hole-accepting and electron-accepting materials to exhibit features of regular shape, uniform size and uniform distribution. These features give excitons a high probability of splitting into electrons and holes, which can migrate to each of their respective electrodes before recombining in the bulk material.

The performance of prior art PV cells is often sub-optimal for one or more reasons. For example, it would be desirable to keep electrons on one side of the active layer and holes on the other, so they cannot recombine before the electrons are pulled out of the device to generate electricity. It would also be desirable for the active layer to absorb light over a broader range of wavelengths than is currently available in a single material. In addition, it would be desirable to enhance light absorption and/or charge injection from the light-absorbing material to the electron-transporting material.

Thus, there is a need in the art for an active layer for an optoelectronic device that overcomes the above disadvantages and a corresponding method of making such an active layer.

SUMMARY OF THE INVENTION

The disadvantages associated with the prior art are overcome by embodiments of the present invention directed to an optoelectronic apparatus, a method for making an active layer for an optoelectronic device, and the use of such an active layer in an optoelectronic device.

According to an embodiment of the present invention, an optoelectronic apparatus may include an active layer having a nanostructured network layer having a network of regularly spaced structures with spaces between neighboring structures. One or more network-filling materials are disposed in the spaces. At least one of the network-filling materials has complementary charge transfer properties with respect to the material of the nanostructured network layer. The interfacial layer is configured to enhance an efficiency of the device. The active layer may be disposed between two electrodes (at least one of which may be transparent) for use in an optoelectronic device.

In some embodiments, the interfacial layer can be configured such that charge-carriers traveling from the nanostructured network layer to the network-filling material are transported at a different rate than the same type of charge-carriers traveling from the network-filling material to the nanostructured network layer. In other embodiments, the interfacial layer can be configured to differentially absorb light, e.g., with two different phase-separated photoactive materials. In further embodiments, the interfacial layer may be configured to enhance light absorption, charge injection or a combination of light absorption and charge injection, e.g. with pigments or dyes.

Embodiments of the present invention provide more efficient optoelectronic devices such as PV cells, in particular solar cells, at relatively low cost.

DETAILED DESCRIPTION

Contents

I. Glossary

II. General Overview

III. Optoelectronic Apparatus

IV. Optoelectronic Apparatus Fabrication

VI. Conclusion

I. GLOSSARY

Figure 1:
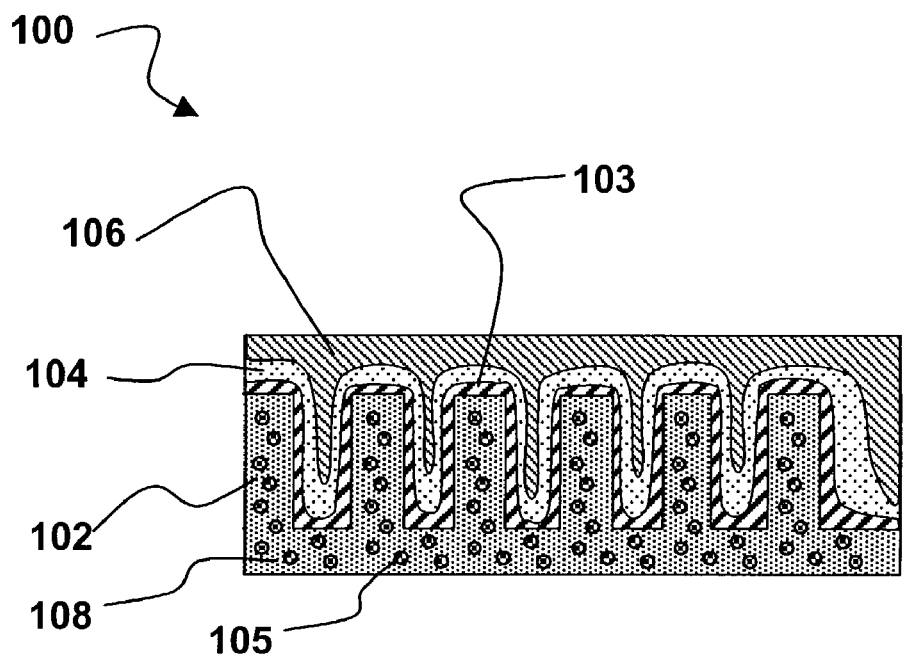
FIG. 1 depicts a cross-sectional schematic diagram of an active layer for an optoelectronic device according to an embodiment of the present invention.

The following terms are intended to have the following general meanings as they are used herein:

Aspect Ratio: refers to the ratio of diameter to height or depth.

Buckminsterfullerene: is a molecule having a network of carbon atoms in a closed cage structure. Because of its soccer-ball-like shape, the buckminsterfullerene molecule is often referred to as a "buckyball." Molecules of this type are also known generally as fullerenes.

Complementary charge-transfer properties: As used herein, a first and second semiconductor or conductor materials are said to have complementary charge-transfer properties with respect to each other when the first material is a hole-acceptor and/or hole-transporter with respect to the second and the second is an electron-acceptor and/or electron-transporter with respect to the first or vice versa.

Device: An assembly or sub-assembly having one or more layers of material.

Efficiency: For an optoelectronic device or active layer, the efficiency is the ratio of energy output (e.g., in the form of electrons) to the necessary energy input (e.g., in the form of photons).

Fullerene: A molecule formed in a hollow, hexagonal or pentagonal group shape. Fullerenes are a class of molecules that have many beneficial properties. For example, some fullerenes, e.g. $C_{60}$ have a perfectly spherical shape with a diameter of about 0.7 nm. Fullerenes also have other useful forms, such as $C_{60}$, $C_{70}$, $C_{76}$, $C_{84}$, etc. Fullerenes have large, protected internal cavities which can be doped with other molecules. Fullerenes have extremely high mechanical strength and very high electronegativity. Fullerenes are soluble in organic solvents and, when functionalized, soluble in aqueous solutions, where they can be reactive. Each of these forms can be functionalized with one molecule, called a mono adduct, or with two molecules, called a dual adduct. Both forms may be useful for applications in optoelectronic devices.

Hole-Acceptor, Electron-Acceptor: Hole-acceptor and electron-acceptor are relative terms for describing charge transfer between two materials. E.g., for two semiconductor materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Inorganic Materials: Materials which do not contain carbon as a principal element. The oxides and sulphides of carbon and the metallic carbides are considered inorganic materials.

Nanostructured Network Layer: generally refers to a film of material having features characterized by a width, or other characteristic dimension, on the order of several nanometers ($10^{-9}$ m) across. Nanostructured network layers may be produced by several techniques, including:

(a) Intercalation and/or grafting of organic or polymeric molecules within a mineral lamellar network comprised of clays, phosphates, phosphonates, etc. The lamellar compounds serve as a network host that preserves the pre-established structural order. Organic molecules are then inserted or grafted into this pre-structured network (which is comprised of mineral(s)).

(b) Synthesis by electrocrystallisation of hybrid molecular assemblies. This synthesis technique drives the construction of highly organized mineral networks with relatively long-range order that can be controlled and adjusted for electronic intermolecular transfer.

(c) Impregnation of preformed inorganic gels. In an example of this technique, a silica xerogel can be formed by hydrolysis and polycondensation of silicon alkoxides with organic monomers (e.g. with monomers that are susceptible to polymerization within the porous gel structure). Methylmethacrylate (MMA) is an example of a suitable organic monomer and the inorganic-organic hybrid obtained after polymerization of the MMA has optical and mechanical properties often superior to the individual components.

(d) Synthesis from heterofunctional metallic alkoxides metallic halides or silsesquioxannes: Precursors of this kind have the formula $R_xM(OR')_{n-x}$ or $3(R'O)Si—R''—Si(OR')3$, where R and R' are either hydrogen (H), any organic functional group or a halide, R'' can be oxygen or an organic functional group, and M is a metal. Typically R and R' involve oxygen, e.g., —O—R and —O—R'. M may be any transition metal, e.g., titanium, zinc, zirconium, copper, lanthanum, niobium, strontium, or silicon, etc. The hydrolysis of alkoxy groups (OR') followed by a condensation reaction will form the mineral network and the R groups will imprint in the network the organic function.

(e) Synthesis of hybrid networks through the connection of well-defined functional nanobuilding blocks. The pre-formatted species or building blocks could be in this case oxo-metallic clusters, nanoparticles, nano-rods, nano-tubes, nano-whiskers (CdS, CdSe, . . . ), metallic or oxides colloids, organic molecules or oligomers. These blocks are functionalized during or after their synthesis with complementary species for tailoring the interface between organic and inorganic domains.

(f) Templated growth of inorganic or hybrid networks by using organic molecules, macromolecules, proteins or fibers as structure directing agents. In general, molecules like amines, alkyl ammonium ions, amphiphilic molecules or surfactants can be used as templates to build a structured mineral network. Materials of the zeolites families are among the most intensively investigated systems. Molecular and supramolecular interactions between template molecules (surfactants, amphiphilic block copolymers, organogelators, etc. . . . ) and the growing hybrid or metal-oxo based network permit the construction of complex hybrid hierarchical architectures.

(g) Templated growth using nanoparticles, as structuring agents followed by removal of the nanoparticles, leaving behind a porous network. The nanoparticles may be made, e.g., of latex, and removed, e.g., by heating the templated film to a sufficient temperature to "burn off" the nanoparticles.

Optoelectronic Device: A device that interacts with radiation and electric current. Such a device could be a radiation-emitting device, e.g. a light-emitting diode (LED) or laser, or a radiation absorbing device, e.g. a photodetector/counter, photovoltaic cell (solar cell) or radiation-driven electrolysis cell.

Organic Solar Cell: A type of solar cell wherein an active photoelectric layer is fabricated, either partly or entirely, using organic materials comprising, e.g., polymers, oligomers, molecules, dyes, pigments (including mixtures) that are predominantly carbon based compounds. These materials may be insulating, conductive or semiconductive or mixes thereof.

Phase Separation: Two materials are said to be phase separated when they form two distinct phases (analogous, e.g., to oil on water) as opposed to being thoroughly intermixed, e.g., in a solution or suspension.

Photovoltaic Device: A type of optoelectronic device that absorbs radiation and coverts energy from the radiation into electrical energy.

Radiation: Energy which may be selectively applied including electromagnetic energy having a wavelength between $10^{-14}$ and $10^4$ meters including, for example, gamma radiation, x-ray radiation, ultraviolet radiation, visible light, infrared radiation, microwave radiation and radio waves.

Semiconductor: As used herein, semiconductor generally refers to a material characterized by an electronic bandgap typically between about 0.5 eV and about 3.5 eV.

Surfactant Templation: In general, surfactant temptation is a particular subcategory of templated growth. As used herein, surfactant temptation refers an approach toward achieving pore size control of inorganic or organic frameworks, e.g., by using surfactants or block copolymers as templates to build a structured mineral network.

Solar Cell: A photovoltaic device that interacts with radiation (often in the form of sunlight) impinging on the device to produce electric power/voltage/current.

Organic Materials: Compounds, which principally consist of carbon and hydrogen, with or without oxygen, nitrogen or other elements, except those in which carbon does not play a critical role (e.g., carbonate salts). Examples of organic materials include:

(a) Organic Dyes and pigments such as perylenes, phthalocyanines, merocyanines, terylenes and squaraines and their derivatives.

(b) Polymers: Materials consisting of large macromolecules composed of more than one repeating units. Polymers, composed of 2-8 repeating units are often referred to as oligomers. Examples of such repeating units include, e.g., dyes or pigments.

II. GENERAL OVERVIEW

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention implement a device layer architecture wherein two materials with complementary charge transfer materials are configured such that (1) the presence of the two materials regularly alternates on a nanometer scale and (2) an interfacial layer between the two materials enhances an efficiency of a device that incorporates the architecture. By way of example, the interfacial layer may be configured to enhance efficiency in the form of one or more of (a) charge transfer between the two materials that exhibits different rates for forward versus backward transport; (b) differential light absorption to extend a range of wavelengths that the active layer can absorb; or (c) enhanced light absorption and/or charge injection. These three enhancements are referred to below as enhancements (a), (b), and (c) respectively. In some embodiments, dopants may be incorporated into one or more of the two materials on either side of the interfacial layer, e.g., to promote charge transport.

FIG. 1 depicts a cross-sectional schematic diagram of an active layer 100 according to an embodiment of the present invention. The active layer 100 generally includes a nanostructured network layer 102, one or more interfacial layers 103, and one or more network filling materials 104, 106. It is desirable for the nanostructured network layer 102 and the network-filling materials 104, 106 to have complementary charge-transfer properties. The active layer 100 may include an optional interface layer 108 between the nanostructured network layer 102 and an underlying electrode. The optional interface layer 108 may be made from the same material as the nanostructured network layer 102.

The nanostructured network layer 102 contains substantially uniformly distributed, e.g., regularly spaced, structures roughly 1 nm to 100 nm in diameter and more preferably, about 10 nm to about 30 nm in diameter. In general, neighboring structures are spaced apart by between about 1 nm and about 100 nm, measured, e.g., from nearest edge to nearest edge. More preferably, the structures are between about 10 nm apart and 30 nm apart, edge-to-edge. In many optoelectronic devices, e.g. photovoltaic devices, it is desirable for the size and spacing of the structures to be on the order of the exciton diffusion length in the material of the nanostructured network layer 102 and network filling materials 104, 106. A substantially uniform distribution of the structures can enhance the overall conversion efficiency of the active layer 100. The nanostructured network layer 102 is made from an inorganic electron-accepting material, such as titania, tin oxide or another metal oxide. In the case of a complementary structure the nanostructured network layer 102 may be made from an organic hole-accepting material.

The nanostructured network layer 102 may be made from an inorganic compound (e.g., an oxide, nitride, oxynitride, etc.) based on a central element X. The central element X may be a transition metal, e.g., Ag, Au, Cd, Co, Cr, Cu, Fe, Ir, Mn, Mo, Nb, Ni, Sr, Ta, Ti, V, W, Y, Zn, Zr, etc. In a preferred embodiment, the central element X is titanium (Ti). In particular, nanostructured network layers made of semiconducting titania ($TiO_2$) are of interest. Titania is an example of an electron-accepting/transporting material. With a band gap of 3.2 eV, Titania ($TiO_2$) absorbs light from the near-ultraviolet region of the spectrum, and the material has relatively high charge mobility. Thus Titania has desirable electronic properties for effective charge-splitting in an active layer of an optoelectronic device. Furthermore, Titania is widely available and relatively inexpensive. Other suitable central elements X include Al, B, Ba, Pb, Se, Si, and Sn.

One or more network filling materials may be used to fill the spaces between the structures in the nanostructured network layer 102. In the example shown in FIG. 1 the spaces are filled using first and second network filling materials 104, 106. The first network-filling material 104 may be a hole-accepting, organic material. In the case of a complementary structure, the first network-filling material 104 may be an electron-accepting inorganic material. Examples of suitable inorganic materials for the first network-filling material 104 include silicon (e.g., with suitable dopants), CdTe, oxides of transition metals, e.g., CuO, ZnO, ZrO $TiO_2$ and the like.

Examples of suitable organic materials for the first network-filling material 104 include conjugated polymers such as poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly (para-phenylene vinylene), (PPV)), poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable polymers include organometallic polymers, polymers containing perylene units, poly(squaraines) and their derivatives. Other suitable organic network-filling materials include organic pigments or dyes, azo-dyes having azo chromofores (—N=N—) linking aromatic groups, phthalocyanines including metal-free phthalocyanine; (HPc), perylenes, naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone.

The second network-filling material 106 may be inorganic e.g., a metal, or organic e.g., a pigment dye or polymer. Examples of suitable organic materials include PEDOT (Baytron), polyaniline or polyacetylene doped with a dopant such as polystyrene sulfonic acid (PSS). In a particular embodiment, the second network filling material 106 is poly-3,4-ethylenedioxythiophene-polystyrenesulfonic acid (PEDOT-PSS).

The interfacial layer 103 may be a single layer or a multilayer structure having two or more sub-layers. Appropriate configuration of the optional interfacial layer 103 can provide the active layer 100 with the desired enhanced efficiency. For example, with respect to enhancement (a) above, the interfacial layer 103 can be configured such that charge-carriers traveling from the nanostructured network layer 102 to the network-filling material 104 are transported at a different rate than the same type of charge-carriers traveling from the network-filling material 104 to the nanostructured network layer 102.

An example of a material for an interfacial layer 103 is carboxylic acid (COOH) functionalized buckminsterfullerene ($C_{60}$), also known as $C_{60}$-acid. The structure of $C_{60}$-acid is depicted schematically in FIG. 2A. The carboxylic acid functionalization provides layers of $C_{60}$ with interesting electronic properties. Specifically, electron transfer out of a $C_{60}$-acid layer occurs at a lower rate than electron transfer into the $C_{60}$-acid layer. In particular, electron transfer into a layer of $C_{60}$-acid occurs with a characteristic time constant on the order of 40-50 femtoseconds while electron transfer out of the same layer occurs with a time constant of order about one millisecond. Thus electrons are far more likely to transfer into the carboxylic acid functionalized $C_{60}$ layer than out of it. Consequently, a layer of carboxylic acid functionalized $C_{60}$ can act as a "one-way gate" for electron transfer.

To make use of the electronic properties of $C_{60}$, it is important to be able to attach the molecule to a surface so that is can be covalently bonded to and thus function as an integrated component of that surface. To do so, $C_{60}$ can be functionalized with a COOH moiety. Alternatively, $C_{60}$ or another fullerene could be functionalized with molecules other than COOH. For example one could make an ester, amide, amine, acid, and so forth to have any of these (or other) chemical linkage groups attached to the fullerene itself. In addition, other functionalized fullerenes may be used in the interfacial layer 103. Such functionalized fullerenes could be mono adducts, or dual adducts, and could be in any of several forms, including $C_{60}$, $C_{70}$, $C_{76}$, and $C_{84}$. For each form, many types of functionalization are possible, e.g., acid-, ester-, amide-, or amine-functionalization, any of which could be useful.

Figure 2A:
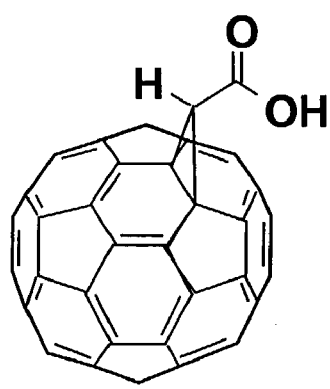
FIG. 2A depicts an isometric schematic diagram of carboxylic acid functionalized $C_{60}$.
Figure 2B:
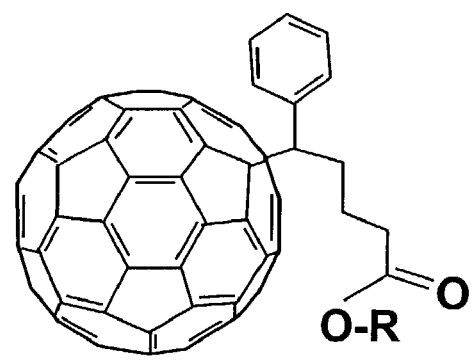
FIG. 2B depicts an isometric schematic diagram of an alternative functionalized fullerene.

FIG. 2B shows an example of an alternative functionalized fullerene structure. In FIG. 2B, R can be any organic functional group. One possible compound within the scope of the structure of FIG. 1B is [6,6]-Phenyl $C_{61}$-butyric acid methyl ester [11] (PCBM). The enhanced solubility of PCBM compared to $C_{60}$ allows a high fullerene-conjugated polymer ratio. The structures shown in FIG. 2A and FIG. 2B are but two particular examples of a general functionalized fullerene structure. Many other possible functionalized structures are suitable for use with embodiments of the present invention. Thus, FIGS. 2A and 2B represent two of several ways to functionalize a fullerene and are by far not the only means of doing so. Furthermore, as an alternative to functionalized fullerenes, the interfacial layer 103 may alternatively use functionalized carbon nanotubes.

With respect to enhancement (b), the interfacial layer 103 can be configured to differentially absorb light, e.g., by providing the active layer 100 with two different phase-separated light-absorbing layers. For example, the interfacial layer 103 may be a photoactive material that absorbs light over an absorption band, i.e., a range of wavelengths, that partially overlaps an absorption band for the first network-filling material 104. A convolution of the two absorption bands can thus provide the active layer 100 as a whole with a broader absorption band than either the interfacial layer 103 or first network filling material 104 by itself. The interfacial layer 103 may be made of two or more sub-layers, each having a different absorption band, to provide an even broader absorption band for the active layer 100. The interfacial layer 103 may be made from materials in the same category (e.g., organic or inorganic) as the network-first filling material 104 but is a different material within that category. Examples of suitable organic and inorganic photoactive materials for the interfacial layer 103 include those listed above with respect to the first network-filling material 104 and their equivalents.

With respect to enhancement (c) above, the interfacial layer 103 may be configured to enhance light absorption and/or charge injection, e.g. with pigments or dyes. In the case of a PV device, at least one of the nanostructured network layer 102, and network-filling materials 104, 106 is a light absorbing material and at least one of these is an electron transporting material. The dye or pigment in the interfacial layer can enhance light absorption in the light absorbing material and/or charge injection from the light absorbing material to the electron absorbing material. Examples of suitable dyes include perylene, ru-polypyridyl, porphoryins, azo-dyes having azo chromofores (—N=N—) linking aromatic groups, phthalocyanines including metal-free phthalocyanine; (HPc), perylenes, naphthalocyanines, squaraines, merocyanines and their respective derivatives, poly(silanes), poly (germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f']diisoquinoline-1,3,8,10-tetrone. Several photosensitizer dyes of the Ru-polypyridine family can also be used: e.g., [(CN)(bpy)$_2$Ru—CN—Ru(dcbpy)$_2$-NCRu(bpy)$_2$], [Ru(4,4-bis(carboxy)-bpy)$_2$(NCS)$_2$] and [Ru(2,2',2"-(COOH)$_3$-terpy)(NCS)$_3$]. The interfacial layer 103 may include two or more sub-layers, each of which may have a different pigment or dye. Furthermore, two or more different dyes may be combined within the same sub-layer.

In a particular embodiment suitable for photovoltaic applications, the nanostructured network layer 102 may be made of an electron-accepting inorganic material, such as titania ($TiO_2$), the interfacial layer 103 may be a layer of carboxylic acid functionalized buckminster fullerene ($C_{60}$-acid), the first network filling material 104 may be a hole-accepting polymer such as MEH-PPV or P3HT and the second network filling material 106 may be a conducting polymer such as PEDOT-PSS. In such an active layer electrons that have been split away from holes move through the hole-accepting polymer into the interfacial layer 103 then into the titania much faster than they move from the titania back into the interfacial layer 103 then into the semiconducting polymer. After charge splitting, the $C_{60}$-acid or other interfacial layer material would keep electrons on one side and holes on the other, so they cannot recombine before the electrons are pulled out of the device to generate electricity.

There are several alternative embodiments within the scope of the present invention. For example, the first network-filling material 104 may be a hole-accepting inorganic material, such as copper oxide. If such were the case in a hybrid organic-inorganic active layer, the nanostructured network layer 102 would be an electron-accepting material.

Furthermore, in the case of a complementary hybrid organic-inorganic structure, the nanostructured network layer 102 may be a hole-accepting organic material and the first network filling material 104 may be an electron-accepting inorganic material. In an example of a complementary structure, a porous silica-based template mold may be filled with an inorganic electron-accepting material. The template mold may be destroyed and washed away leaving behind a nanostructured network layer 102, e.g., in the form of "columns" of the inorganic material. The interfacial layer 103 may be disposed on the columns and spaces between the columns may then be filled with organic hole-accepting network-filling material(s) 104, 106.

In some embodiments, the interfacial layer 103 may use some mixture of dyes, pigments, photoactive materials, fullerenes and/or carbon nanotubes, either in the same layer, or in different sub-layers. Thus, the interfacial layer 103 may implement combinations of two or more of the enhancements (a), (b) and (c). For example, two or more enhancements may be combined within the same sub-layer or with each in a different sub-layer or with two or more different enhancements combined in each of two or more different sub-layers. There are a number of different possible variations on these combinations that are within the scope of embodiments of the present invention.

In some embodiments, the nanostructured network layer 102 and/or interface layer 108 may optionally include one or more dopants 105 to differentially configure the charge transfer properties of the active layer 100. For example, an X-based oxide nanostructured network layer might be doped with fullerenes (e.g., $C_{60}$), metals, or other materials that affect charge transport and/or light absorption and/or charge injection. If fullerenes are used as the dopants 105 to enhance charge transport, it is often desirable to dope the fullerenes that are normally semiconducting with atoms that make them conducting or "metallic". Alternatively, the nanostructured network layer 102 may be doped with lithium, indium, and rare earth metals (such as europium). Although, for the sake of simplicity, only the nanostructured network layer 102 is shown as being doped it is possible instead to dope one or more of the network filling materials 104, 106 in ways that provide the desired configuration of charge transport properties. Furthermore, both the nanostructured network layer 102 and the network filling materials 104, 106 may be doped. In addition, although the active layer 100 is depicted having both an interface layer 103 and dopants 105, it is possible to use one without the other.

Figure 3:
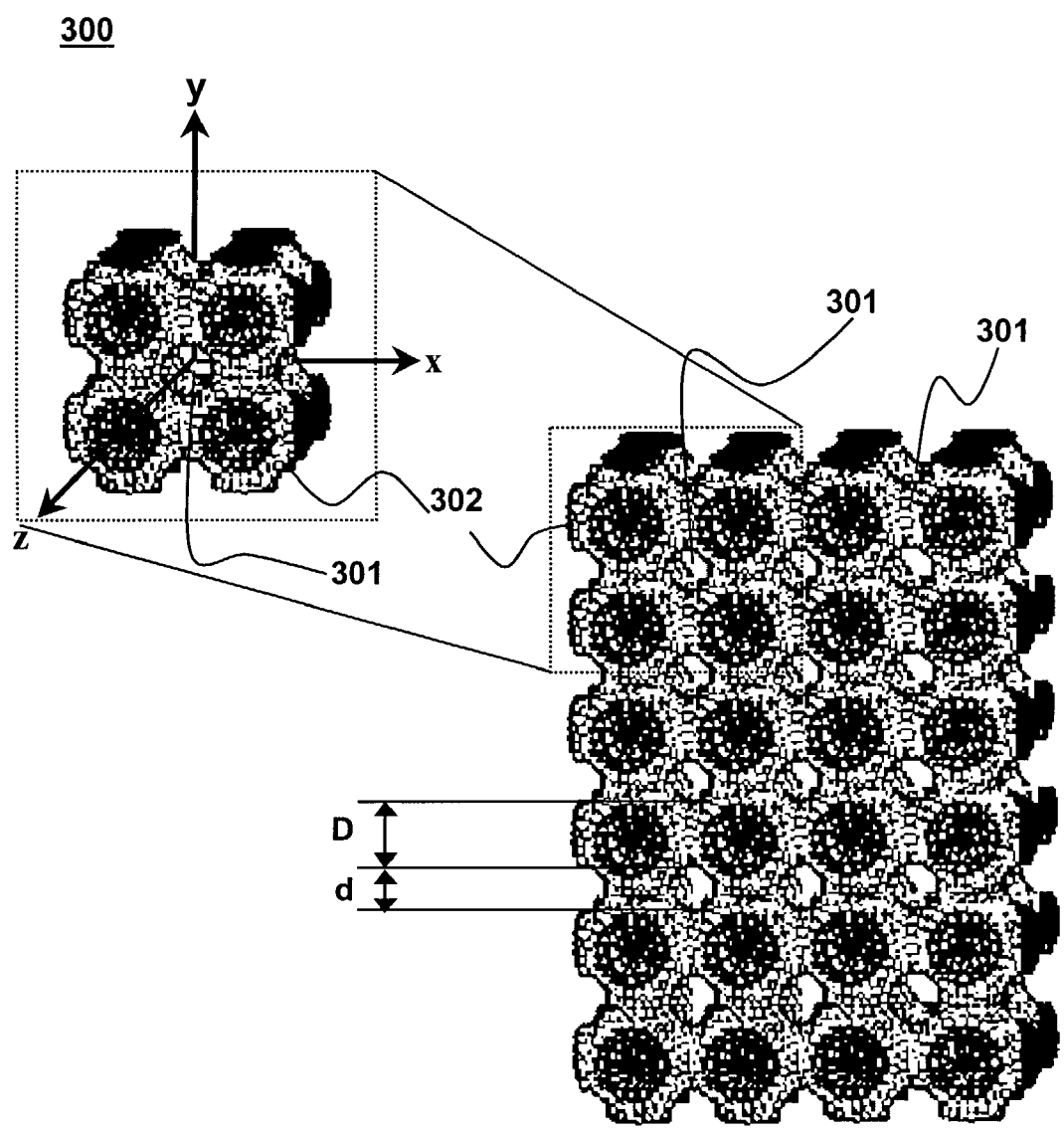
FIG. 3 depicts an isometric close-up view of a portion of a possible structure for a nanostructured network layer for use in an active layer according to an embodiment of the present invention.

FIG. 3 depicts a simplified and somewhat idealized diagram of a desirable morphology for a nanostructured network layer 300 that may be used in the active layer 100 of FIG. 1. The nanostructured network layer 300 has structures 302 with spaces in the form of pores 301 between neighboring structures 302. The pores may run along x, y and z directions and intersect with each other as shown in the inset in FIG. 3. The pores 301 may be characterized by a diameter d. The nanostructured network layer 300 may be characterized by a spacing D between neighboring pores 301, measured e.g., from edge-to-edge. The pore diameter d and pore spacing D are substantially uniform across the nanostructured network layer 300. The pores 301 are interconnected with each other in a way that provides continuous paths between opposite surfaces of the nanostructured network layer 300. The paths through the pores 301 provides access to the pores from a layer overlying or a layer underlying the nanostructured network layer 300. When the pores 301 are filled with a suitable network-filling material, charges can migrate through the network-filling material from the overlying layer to the underlying layer and/or vice versa.

It is often desirable for the pores 301 to have a high aspect ratio. An aspect ratio of 100 (e.g., 10 nm diameter pores 1000 nm deep) is suitable for many optoelectronic device applications.

The nanostructured network layer 300 may serve as a sacrificial template for making a nanostructured grid network. The structures 302 may be removed, e.g., by etching, after the pores 301 are filled with the pore filling material leaving behind a nanostructured grid network having structures (e.g., columns) made of the network-filling material. The columns can be roughly characterized as having diameter d and neighboring structures are separated by a distance of approximately D measured edge-to-edge. Empty spaces between the columns can then be filled with a network filling material having complementary charge transfer properties with respect to the pore filling material that forms the structures.

III. OPTOELECTRONIC DEVICE ARCHITECTURE

Figure 4:
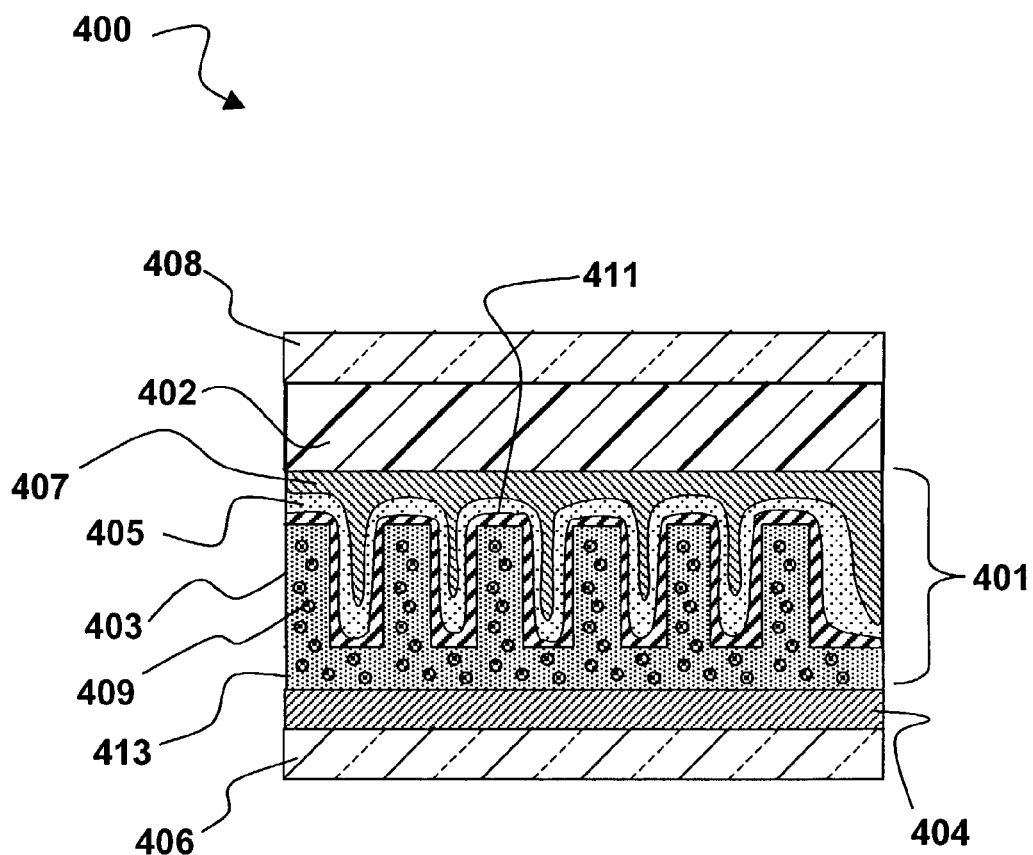
FIG. 4 shows a cross-sectional schematic diagram of an optoelectronic device according to an embodiment of the present invention.

FIG. 4 depicts an example of a device structure for an optoelectronic device 400 according to an embodiment of the present invention. The optoelectronic device 400 generally includes an active layer 401 disposed between a transparent conducting electrode (TCE) 402 a base electrode 404. The device 400 may be modularized by well-known encapsulation in order to improve weather resistance and mechanical strength e.g., with an optional substrate and/or encapsulant layers 406, 408.

The active layer 401 includes a nanostructured network layer 403 and one or more network filling materials e.g., semiconducting and conducting network-filling materials 405, 407 respectively as described above with respect to FIG. 1. The nanostructured network layer 405 may have a structure of the type described above with respect to FIG. 3. The nanostructured network layer may include dopants 409, (e.g., functionalized fullerenes, metals, etc.) as described above. An interfacial layer 411 (e.g., functionalized fullerene, etc.) may be disposed between the nanostructured network layer 403 and the network filling materials 405, 407, as described above with respect to FIG. 1. An interface layer 413 may be disposed between the base electrode 404 and the nanostructured network layer 405.

The TCE 402 may be a layer of transparent conducting oxide (TCO) such as indium tin oxide (ITO). The TCE 402 may optionally include (either with or without a TCO) some combination of a transparent conducting polymer, a thin metal layer or an array of spaced apart wires, e.g., in the form of a mesh, grid or parallel wires.

The base electrode 404, may be in the form of a commercially available sheet material such as such as C-, Au-, Ag-, Al-, or Cu-coated Steel Foil or metal/alloy-coated plastic foils, including metal or metalized plastic substrates/foils that are planarized to reduce surface roughness. The base electrode 404 may optionally be a TCE.

The optional encapsulants 406, 408 protect the optoelectronic device 400 from the surrounding environment. The encapsulants 406, 408 may also absorb UV-light to protect organic materials disposed between the encapsulants 406, 408. Examples of suitable encapsulant materials include one or more layers of glass or polymers, such as polyethylene terephthalate (PET) and/or Mylar®. Mylar is a registered trademark of E. I. du Pont de Nemours and Company of Wilmington, Del. Either encapsulant layers 406, 408 may include EVA (ethylene vinyl acetate), which has favorable adhesive, weather resistance, and buffer effect properties.

In order to further improve moisture resistance and scratch resistance, a fluorine resin may be laminated to the encapsulant layers 406, 408 as a surface protecting layer. For example, tetra-fluoro ethylene copolymer (TFE, Du Pont TEFLON), copolymer of tetra-fluoroethylene and ethylene (ETFE, Du Pont TEFZEL), polyvinyl fluoride (Du Pont TEDLAR), polychlorofluoroethylene (CTFEC, Daikin Industries Neoflon) may be used. Weather resistance can also be improved by adding a well-known UV absorber. In addition to glass, other inorganic materials, such as ceramics and metal foils may also be used for the encapsulants 406, 408. The encapsulants 406, 408 may also include nitrides, oxides, oxynitrides or other inorganic materials that protect against exposure to water or air. In particular, the encapsulant may be a multi-layer stack or a foil comprising a multi-layer stack of organic materials with inorganic dielectrics.

IV. ACTIVE LAYER FABRICATION

Figure 5:
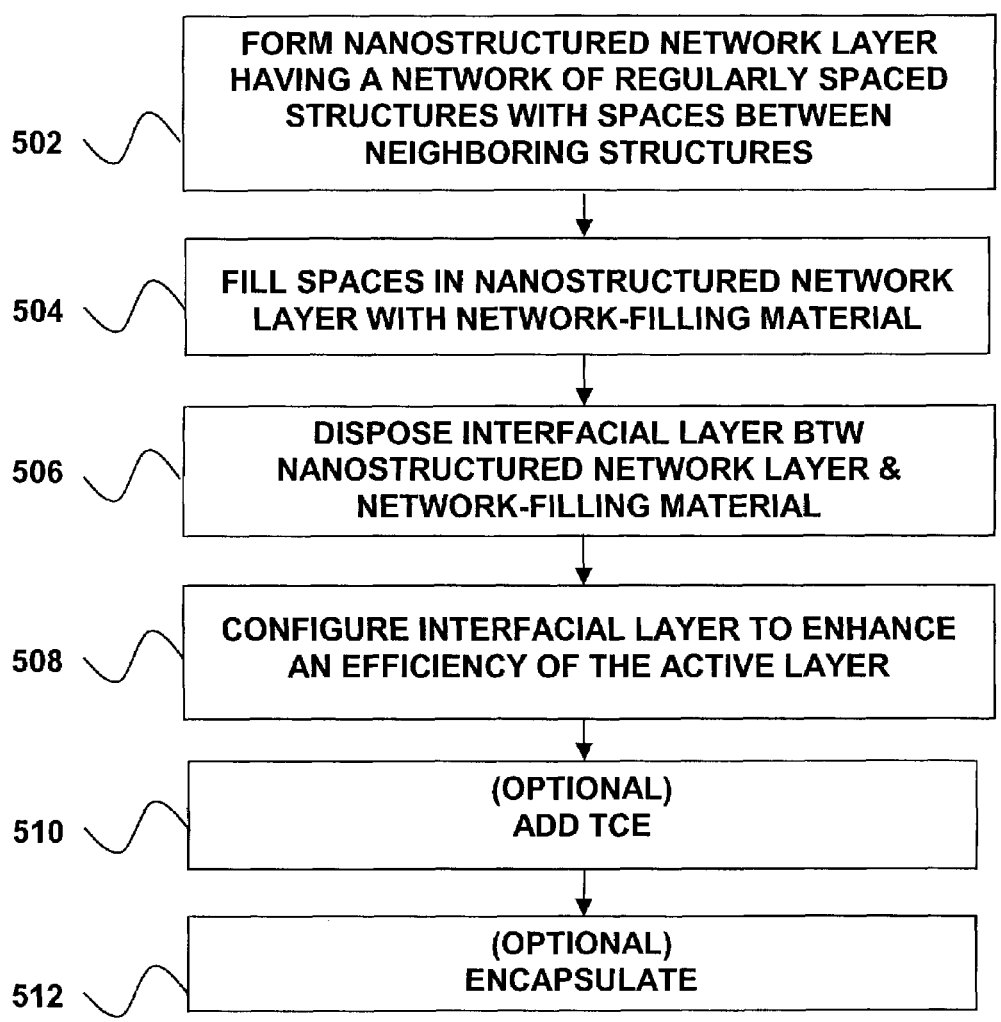
FIG. 5 is flow diagram illustrating a method of forming an active layer for an optoelectronic device according to embodiments of the present invention.

An active layer for an optoelectronic device of the type described above may be fabricated according to a method according to an embodiment of the present invention. FIG. 5 depicts of flow diagram illustrating the method. The method is best understood by referring to FIG. 4 and FIG. 5. The method begins at 502 by forming the nanostructured network layer 403. Subsequently, at 504, spaces in the nanostructured network layer are filled with one or more network-filling materials 405, 407. At 506 an interfacial layer is disposed between the nanostructured network layer 403 and the network filling materials 405, 407. At 508 the interfacial layer 403 is configured to enhance an efficiency of the resulting active layer 401 or device 400. For the sake of simplicity, in FIG. 5 the configuring step 506 is shown after steps 502, 504 and step 508 is shown after step 506.

As a practical matter the interfacial layer disposition step 506 can occur between the nanostructured layer formation step 502 and the network-filling step 504. The acts that constitute the configuring step 508 may occur before, during, after and/or in conjunction with step 502, 504 or 506.

With respect to step 502, examples of techniques for forming the nanostructured network layer 403 include, but are not limited to: (a) Intercalation and/or grafting of organic or polymeric molecules within a mineral lamellar network; (b) synthesis by electrocrystallisation of hybrid molecular assemblies; (c) impregnation of preformed inorganic gels; (d) synthesis from heterofunctional metallic alkoxides metallic halides or silsesquioxannes; (e) synthesis of hybrid networks through the connection of well-defined functional nanobuilding blocks; (f) templated growth of inorganic or hybrid networks by using organic molecules, macromolecules, proteins or fibers as structure directing agents; and (g) templated growth using nanoparticles as structuring agents followed by removal of the nanoparticles.

In a particular embodiment nanostructured network layers of the type described with respect to FIG. 1 and FIG. 3 may be formed by surfactant templation using a precursor sol. Examples of surfactant-templation techniques for producing porous films are described, e.g., by Brinker, et al in U.S. Pat. No. 6,270,846, the disclosures of which are incorporated herein by reference. The precursor sol generally includes one or more alkoxides with a central element X, one or more surfactants, one or more condensation inhibitors, water, and a solvent. The solvent can be a polar organic solvent or any other solvent that solubilizes the other reactants. Examples of suitable solvents include alcohols, (e.g., methanol, ethanol, propanol, butanol), tetrahydrofuran, and formamide or mixtures thereof. For $TiO_2$-based porous surfactant templated films examples of suitable alkoxides include titanium ethoxide or titanium isopropoxide. For $SiO_2$-based surfactant templated films examples of suitable alkoxides include polysiloxanes such as tetraethylorthosilicate (TEOS). As part of the configuring step 506 dopants may optionally be added to the precursor sol. Dopants such as fullerenes, (doped or undoped) metals, etc. may be added to the sol e.g., from a stock solution. To dope with a metal, an alkoxide of the metal can be mixed with the alkoxides(s) of central element X (for example titanium isopropoxide) in the sol gel precursor stock.

Examples of suitable surfactants include $HO(CH_2CH_2CO)_n(CH_2CHCH_3O)_m(CH_2CH_2O)_nH$, where the subscripts m and n are integers. A particular surfactant of this type is the block copolymer poly(ethyleneoxide)-b-poly(propyleneoxide)-b-poly(ethyleneoxide) (n=20, m=70, n=20), sometimes known commercially as Pluronic P123. Pluronic is a registered trademark of BASF Corporation of Ludwigshafen, Germany. Other suitable surfactants include hexadecyl trimethylammonium bromide (CTAB), polyoxyalkylene ether (e.g. Pluronic F127), and poly(oxyethylene) cetyl ether (e.g., Brij56 or Brij58) Brij is a registered trademark of Atlas Chemicals of Wilmington Del. Brij 56 is also known as polyoxyethylene 10 cetyl ether. Brij 58 has several synonyms, including poly(oxyethylene) cetyl ether, poly(oxyethylene) palmityl ether, polyethylene oxide hexadecyl ether, and polyethylene glycol cetyl ether.

Examples of suitable condensation inhibitors include acids such as hydrochloric acid (HCl), sulfuric acid ($H_2SO_4$), nitric acid ($HNO_3$), etc., bases such as sodium hydroxide (NaOH), triethylamine, etc., and chelating agents, including acetyl acetone, alcohol amines, peroxides, etc.

Generally speaking, the molar ratios of the surfactant, condensation inhibitor, ethanol and water may be in the following ranges with respect to the central element X, where X refers to the central element or inorganic network atom in the alkoxide:

[Surfactant]/[X]: a molar ratio ranging from about $1 \times 10^{-7}$ to about 0.1

[Solvent]/[X]: a molar ratio ranging from about 3 to about 50

[Condensation Inhibitor]/[X]: a molar ranging ratio from about $1 \times 10^{-5}$ to about 5

[water]/[X]: a molar ratio ranging from about 0 to about 20.

The sol may be filtered and a thin film prepared from this solution may be disposed on a substrate by spin-coating, web-coating, dip-coating, spray-coating, ink-jet printing, doctor blade coating, spray coating, printing such as screen-printing, ink-jet printing, flexographic printing, gravure printing, micro-gravure printing, and the like. When making a device of the type shown in FIG. 4, the substrate may be the base electrode 404. In such a case, the precursor sol may be disposed directly on the surface of the base electrode 404, or the surface of an intervening layer such as the interface layer 413. The solvent is evaporated from the precursor sol to form a surfactant-templated porous film.

The surfactant-templated porous film may be covalently crosslinked to permanently fix its structure. The crosslinking may be implemented, e.g., by heating the surfactant templated film. During this step, the surfactant templates can be also be selectively removed, e.g., through exposure to heat. By way of example, heating the as-coated film to between about 170° C. and about 400° C. is typically sufficient to covalently crosslink the surfactant-templated porous film and/or decompose the surfactant molecules while remaining within the thermal stability range of the underlying substrate.

Furthermore, either as an alternative to heating, or in conjunction with heating, the surfactant template may be exposed to energetic radiation, such as ultraviolet (UV) radiation, to facilitate crosslinking of the grid to form a mesoporous grid and to destroy the structure of the surfactant and make it easier to wash out.

In some embodiments the crosslinked surfactant-templated porous film serves as the nanostructured network layer. For example, where X is titanium, the crosslinked surfactant-templated porous film can provide a $TiO_2$ nanostructured network layer with a structure like that shown in FIG. 3. Alternatively X may be silicon, in which case a structure like that shown in FIG. 3 made of $SiO_2$ can serve as a porous template. The pores in the template may be filled with a suitable inorganic pore-filling material, e.g., by electrodeposition. The $SiO_2$ template may then be removed, e.g., by chemical etching in a solution of sodium hydroxide (NaOH), potassium hydroxide (KOH), or hydrofluoric acid (HF) followed by suitable washing of any $SiO_2$ debris. The removal of the porous template leaves behind structures made from the pore filling material with essentially the same size and shape as the pores. The structures are separated by spaces left behind by the removal of the porous template film.

With respect to 504, the network-filling materials 405, 407 may be provided in the form of process solutions containing a precursor materials and solvents. As part of this step, the process solution for forming the semiconducting network filling material 405 may include dopants that provide the network-filling materials 405, 407 with desirable charge transfer and/or light absorption properties. The process solution may be applied to the nanostructured network layer 403 by any suitable technique, e.g., web-coating, doctor blade coating, spray coating, spin coating, or a printing technique such as printing such as screen-printing, ink-jet printing, flexographic printing, gravure printing, micro-gravure printing, and the like. Heat may be applied to the nanostructured network layer and network-filling material during this step, e.g., to evaporate solvents and set the network-filling material and/or to assist material infiltration, e.g., through capillary action and/or osmotic force.

With respect to the interfacial layer disposition step 506, the interfacial layer 411 may be disposed between the nanostructured network layer 403 and the network filling materials 405, 407 by coating the nanostructured network layer 403 before filling the spaces with the first network filling material 405. The interfacial layer 411 coats a surface of the nanostructured network layer 403 including at least a portion of the walls of one or more of the structures. For example, a stock solution or process solution for forming the desired interfacial layer 411 may be disposed on the surfaces of the structures in the nanostructured network layer 403, e.g., by spin-coating, web-coating, dip-coating, spray-coating, ink-jet printing, doctor blade coating, spray coating, printing such as screen-printing, ink-jet printing, flexographic printing, gravure printing, micro-gravure printing, and the like. Solvents can then be evaporated from the stock or process solution leaving behind the desired interfacial layer 411. In embodiments involving an interfacial layer 411 with multiple sub-layers, each sub-layer may be laid down in sequence using different stock solutions or process solutions. The solvent may be evaporated from one sub-layer before setting down the solution for the next sub-layer.

With respect to enhancement (a) the configuration step 508 may involve configuring the interfacial layer such that charge-carriers traveling from the nanostructured network layer 403 to the network-filling material(s) 405/407 are transported at a different rate than the same type of charge-carriers traveling the other way round. As described above, the interfacial layer 411 may include a functionalized fullerene, carbon nanotube, dye or other suitable material. By way of example, a fullerene (e.g., $C_{60}$) can be functionalized before coating in an independent, parallel reaction, then stored in a stock solution until needed for disposition on surfaces of the nanostructured network layer 403.

One approach, among others, to making a functionalized fullerene stock solution is to start with 1,2-dihydro-1,2-methanofullerene[60]-61-carboxylic acid ($C_{60}$-acid) prepared along the following lines. Reaction of $C_{60}$ and (ethoxycarbonyl)methyl diazoacetate yields an isomer mixture, which is equilibrated to methanofullerene ester after heating in toluene, after which the ester is hydrolyzed to $C_{60}$-acid by treatment with boron tribromide in benzene. As stated above, $C_{60}$ (or other fullerenes) could also be functionalized with molecules other than COOH—e.g. one could make an ester, amide, amine, acid, and so forth to have any of these (or other) chemical linkage groups attached to the fullerene itself. For example, to make a reactive ester of the $C_{60}$-acid one can use common reagents such, as N-Hydroxysuccinimide (NHS) or dicyclohexylcarbodiimide (DCI).

In the case of a nanostructured network layer 403 made of a metal oxide such as $TiO_2$ it is also important to "functionalize" the oxide surface to permit some —OH groups to form, which can then react with the appropriate functional group such as a carboxylic acid moiety on the $C_{60}$ molecule. To functionalize the titania surface, one typically exposes the surface first to a base, e.g., NaOH and the like, and then to an acid, e.g., HCl and the like. Exposing the surface to a base and converting the bound oxygen into a liberated OH—e.g. by hydrolyzing a bond can increase the local oxygen content on the surface. Alternatively, one could treat the surface with an agent that would liberate some of the —OH groups on the titania surface, e.g. by generating metal-OH groups on the surface of the metal oxide, making an active ester of the $C_{60}$—COOH, and attaching it to the metal-OH region of the metal oxide.

With respect to enhancement (b), the configuration step 508 may involve providing the interfacial layer 411 with differential light absorption through appropriate choice of the photoactive materials that will form the first network filling material 405 and the interfacial layer 411. In such a case, the interfacial layer 411 can be prepared from a stock solution similar to the process solution used to form the first interfacial layer 405.

With respect to enhancement (c), the configuration step may involve providing the interfacial layer 411 with enhanced light absorption, e.g., through appropriate choice of the pigment or dye in the interfacial layer 411. In such a case, the interfacial layer 411 can be prepared from a stock solution similar to the process solution used to form the first interfacial layer 405.

Once the spaces in the nanostructured network layer 403 have been filled with the interfacial layer 411 and the first network-filling materials 405, the rest of the device 400 may be fabricated in a relatively straightforward fashion. For example, an additional process solution may be applied over the first network-filling material 405 to provide the second pore-filling material 407, which can act as an interface between the first pore-filling material 405 and the TCE 402. At 510 the TCE 402 can then be attached to or deposited on the surface of the active layer 401 (e.g., the exposed surface of the second pore-filling material 407). The TCE 402, active layer 401 and base electrode 404 can then be laminated between the encapsulants 406, 408 at 512.

VI. CONCLUSION

While the above is a complete description of the preferred embodiment of the present invention, it is possible to use various alternatives, modifications and equivalents. It is to be understood that the above description is intended to be illustrative and not restrictive. Many embodiments and variations of the invention will become apparent to those of skill in the art upon review of this disclosure. Merely by way of example a wide variety of materials, precursors and reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

What is claimed is:

1. An optoelectronic apparatus, comprising:
   an active layer including:
   a nanostructured network layer having a network of regularly spaced structures with spaces between neighboring structures, wherein the structures are interconnected and wherein interconnections between structures comprise of a material that is the same as a material used to form the structures;
   one or more network-filling materials disposed in the spaces, wherein at least one network-filling material has complementary charge transfer properties with respect to the material of the nanostructured network layer;
   an interfacial layer disposed between the nanostructured network layer and network-filling material,
   wherein the interfacial layer is configured to enhance an efficiency of the apparatus;
   wherein the interfacial layer includes at least one of the following: an acid-, ester-, amide-, amine-, or other-functionalized fullerene, or functionalized carbon nanotubes.

2. The apparatus of claim 1 wherein the interfacial layer is configured such that charge-carriers traveling from the nanostructured network layer to the network-filling material are transported at a different rate than the same type of charge-carriers traveling from the network-filling material to the nanostructured network layer.

3. The apparatus of claim 2 wherein the interfacial layer includes functionalized $C_{60}$, PCBM, $C_{60}$, $C_{70}$, $C_{76}$, $C_{84}$ or other functionalized fullerenes in mono-adduct or dual-adduct mode.

4. The apparatus of claim 1 wherein the interfacial layer is configured to differentially absorb light to extend a range of wavelengths that the active layer can absorb.

5. The apparatus of claim 4 wherein the interfacial layer includes a photoactive material that is phase-separated from a photoactive network filling material.

6. The apparatus of claim 5 wherein the photoactive material in the interfacial layer is characterized by a different absorption band than the photoactive network-filling material.

7. The apparatus of claim 1 wherein the interfacial layer is configured to enhance absorption of light.

8. The apparatus of claim 7 wherein the interfacial layer includes one or more dyes or pigments.

9. The apparatus of claim 7 wherein the interfacial layer is configured to enhance charge injection from a light absorbing material to an electron transporting material in the active layer.

10. The apparatus of claim 1 wherein one or more of the nanostructured network layer and the network filling material includes one or more dopants.

11. The apparatus of claim 10 wherein the one or more dopants include one or more fullerenes, one or more metals, one or more dyes pigments or other photoactive materials.

12. The apparatus of claim 1 wherein the interfacial layer includes two or more sub-layers.

13. The apparatus of claim 1 wherein the regularly spaced structures are between about 1 nm and about 100 nm in diameter.

14. The apparatus of claim 13, wherein the regularly spaced structures are spaced apart by between about 1 nm and about 100 nm measured edge to edge.

15. The apparatus of claim 1 further comprising:
    a base electrode; and
    a transparent conducting electrode;
    wherein the active layer is disposed between the base electrode and the transparent conducting electrode.

16. The apparatus of claim 1 wherein the structures are regularly arrayed in at least 2 dimensions.

17. The apparatus of claim 1 wherein the interfacial layer comprises of a multi-layer structure having two or more sub-layers.

18. The apparatus of claim 1 wherein the material comprises of an electron accepting material.

19. An optoelectronic apparatus, comprising:
    an active layer including:
    a nanostructured network layer having a network of regularly spaced structures with spaces between neighboring structures;
    one or more network-filling materials disposed in the spaces, wherein at least one network-filling material has complementary charge transfer properties with respect to the material of the nanostructured network layer;
    an interfacial layer disposed between the nanostructured network layer and network-filling material,
    wherein the interfacial layer is configured to enhance an efficiency of the apparatus;
    wherein the interfacial layer has a material property such that charge-carriers traveling from the nanostructured network layer to the network-filling material are transported at a different rate than the same type of charge-carriers traveling from the network-filling material to the nanostructured network layer;

wherein the interfacial layer includes at least one of the following: an acid-, ester-, amide-, amine-, or other-functionalized fullerene, or functionalized carbon nanotubes.

20. The apparatus of claim 19 wherein the interfacial layer includes functionalized $C_{60}$, PCBM, $C_{60}$, $C_{70}$, $C_{76}$, $C_{84}$ or other functionalized fullerenes in mono-adduct or dual-adduct mode.

21. An optoelectronic apparatus, comprising:
an active layer including:
a nanostructured network layer having a network of regularly spaced structures with spaces between neighboring structures, wherein neighboring structures are shaped to interconnect to each other in the network layer;
one or more light absorbing, photoactive network-filling materials disposed in the spaces, wherein at least one network-filling material has complementary charge transfer properties with respect to the material of the nanostructured network layer;
an interfacial layer disposed between the nanostructured network layer and network-filling material,
wherein the interfacial layer is configured to enhance an efficiency of the apparatus;
wherein the interfacial layer includes at least one of the following: an acid-, ester-, amide-, amine-, or other-functionalized fullerene, or functionalized carbon nanotubes.

22. The apparatus of claim 21 wherein the interfacial layer is configured to differentially absorb light to extend a range of wavelengths that the active layer can absorb.

23. The apparatus of claim 21 wherein the interfacial layer includes a photoactive material that is phase-separated from a photoactive network filling material.

24. The apparatus of claim 23 wherein photoactive material in the interfacial layer is characterized by a different absorption band than the photoactive network-filling material.

25. The apparatus of claim 21 wherein the interfacial layer is configured to enhance absorption of light.

26. The apparatus of claim 25 wherein the interfacial layer includes one or more dyes or pigments.

27. The apparatus of claim 25 wherein the interfacial layer is configured to enhance charge injection from the light absorbing network filling material to an electron transporting material in the active layer.

28. The apparatus of claim 21 wherein one or more of the nanostructured network layer and the network filling material includes one or more dopants.

29. The apparatus of claim 28 wherein the one or more dopants include one or more fullerenes, one or more metals, one or more dyes pigments or other photoactive materials.

30. The apparatus of claim 21 wherein the interfacial layer comprises of a multi-layer structure having two or more sub-layers.

31. The apparatus of claim 21 wherein the material comprises of an electron accepting material.

32. An optoelectronic apparatus, comprising:
an active layer including:
a nanostructured network layer having a network of regularly spaced structures with spaces between neighboring structures;
one or more network-filling materials disposed in the spaces, wherein at least one network-filling material has complementary charge transfer properties with respect to the material of the nanostructured network layer;
an interfacial layer disposed between the nanostructured network layer and network-filling material,
wherein the interfacial layer is configured to enhance an efficiency of the apparatus;
wherein the interfacial layer is configured such that charge-carriers traveling from the nanostructured network layer to the network-filling material are transported at a different rate than the same type of charge-carriers traveling from the network-filling material to the nanostructured network layer;
wherein the interfacial layer includes at least one of the following: functionalized $C_{60}$, PCBM, $C_{60}$, $C_{70}$, $C_{76}$, $C_{84}$, other functionalized fullerenes in mono-adduct or dual-adduct mode, acid-, ester-, amide-, amine-, or other-functionalized fullerene, or functionalized carbon nanotubes.

* * * * *